United States Patent [19]

Homma et al.

[11] Patent Number: 4,735,916
[45] Date of Patent: Apr. 5, 1988

[54] METHOD OF FABRICATING BIPOLAR TRANSISTORS AND INSULATED GATE FIELD EFFECT TRANSISTORS HAVING DOPED POLYCRYSTALLINE SILICON CONDUCTORS

[75] Inventors: Hideo Homma, Hitachi; Yutaka Misawa, Katsuta; Naohiro Momma, Hitachi, all of Japan

[73] Assignee: Hitachi, Ltd., Tokyo, Japan

[21] Appl. No.: 13,252

[22] Filed: Feb. 10, 1987

[30] Foreign Application Priority Data

Jul. 9, 1986 [JP] Japan .................. 61-159631

[51] Int. Cl.$^4$ ........................... H01L 21/385
[52] U.S. Cl. ...................... 437/57; 437/152; 437/153; 437/162
[58] Field of Search ............ 437/57, 152, 153, 162

[56] References Cited

U.S. PATENT DOCUMENTS

| | | | |
|---|---|---|---|
| 4,127,931 | 12/1978 | Shiba | 437/162 X |
| 4,306,915 | 12/1981 | Shiba | 437/70 X |
| 4,354,309 | 10/1982 | Gardiner et al. | 437/162 X |
| 4,381,953 | 5/1983 | Ho et al. | 357/34 X |
| 4,481,706 | 11/1984 | Roche | 437/162 X |
| 4,483,726 | 11/1984 | Issac et al. | 437/162 X |
| 4,494,304 | 1/1985 | Yoshioka | 437/162 X |
| 4,531,282 | 7/1985 | Sakai et al. | 357/34 X |
| 4,581,319 | 4/1986 | Wieder et al. | 437/162 X |
| 4,616,401 | 10/1986 | Takeuchi | 437/70 X |

Primary Examiner—George T. Ozaki
Attorney, Agent, or Firm—Antonelli, Terry & Wands

[57] ABSTRACT

A method of fabricating a semiconductor device includes the steps of: forming at least one first semiconductor region of a first conductivity type and at least one second semiconductor region of a second conductivity type in a main surface of a semiconductor layer of the first conductivity type; forming a three-layer film having a desired shape on each of the first and second semiconductor regions, the three-layer film being made up of a bottom layer which is a conductive film, an intermediate layer which is a silicon nitride film, and a top layer which is a polycrystalline silicon film doped with one of arsenic and phosphorus; forming a first insulating layer on the side wall of the three-layer film; forming a second polycrystalline silicon film on the whole surface, and diffusing one of arsenic and phosphorus from the first polycrystalline silicon film into the second polycrystalline silicon film; selectively etching off the first polycrystalline silicon film and that portion of the second polycrystalline silicon film, in which one of arsenic and phosphorus has been diffused; forming a second insulating layer at least on the surface of the portion of the second polycrystalline silicon film which exists on the second semiconductor region; removing the silicon nitride film and the conductive film which exist on the second semiconductor region, while using the second insulating layer as a mask, to form an aperture; and forming a third polycrystalline silicone film so that the aperture is covered by the third polycrystalline silicon film.

19 Claims, 8 Drawing Sheets

FIG. IA 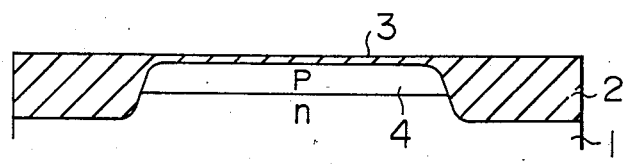
FIG. IB 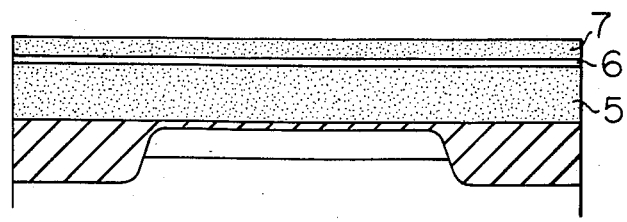
FIG. IC 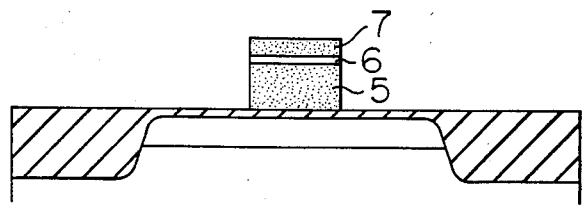
FIG. ID 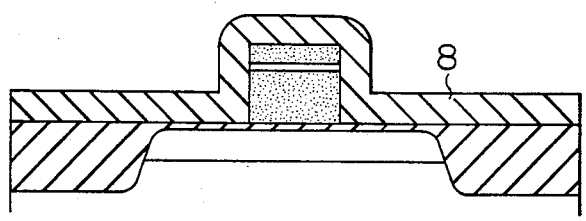
FIG. IE 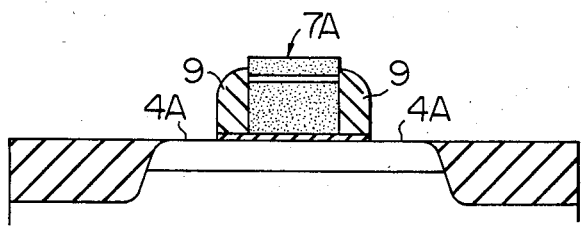
FIG. IF 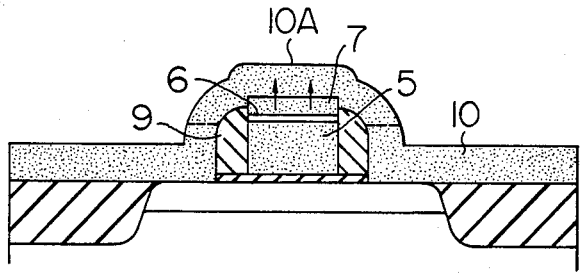

FIG. IG 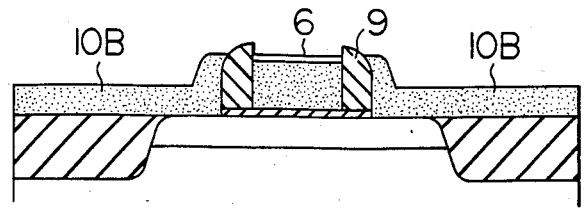
FIG. IH 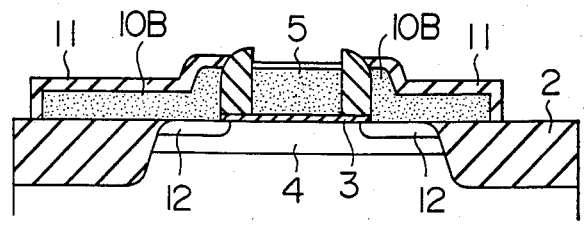
FIG. II 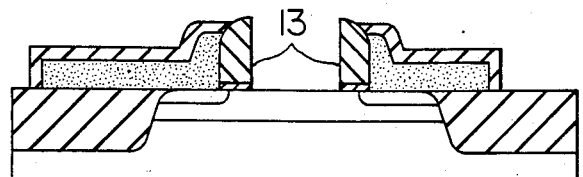
FIG. IJ 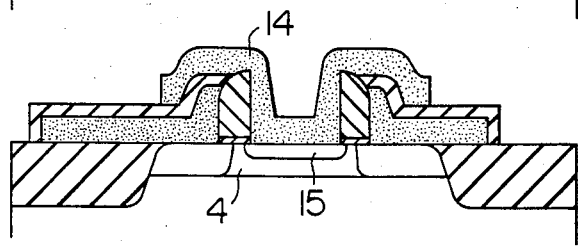
FIG. IK 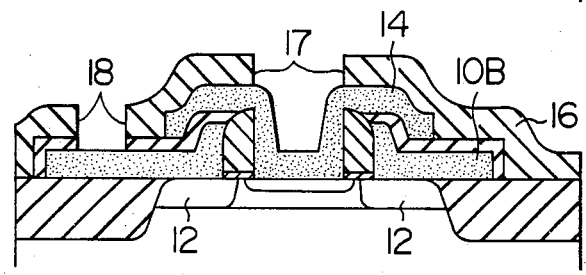
FIG. IL 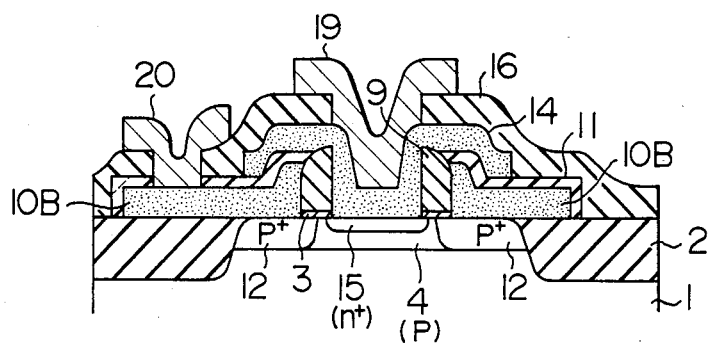

METHOD OF FABRICATING BIPOLAR TRANSISTORS AND INSULATED GATE FIELD EFFECT TRANSISTORS HAVING DOPED POLYCRYSTALLINE SILICON CONDUCTORS

BACKGROUND OF THE INVENTION

The present invention relates to a method of fabricating a semiconductor device, and more particularly to a method of fabricating a bipolar transistor device, an MOS field effect transistor device, or a composite device including a bipolar transistor and an MOS field effect transistor, suitable for a high packing-density structure and a high speed operation.

The minimum dimension of patterns used in a semiconductor integrated circuit is now reduced to the order of submicron. Thus, reduction in the size of a semiconductor region and the shortening of the response time thereof are restricted by the accuracy of mask alignment in lithographic techniques. For example, the area of the extrinsic or outer base region of bipolar transistor is determined by the mask alignment accuracy in forming a contact portion where a base electrode is kept in contact with the extrinsic base region, and hence it is impossible to make the extrinsic base region smaller than a size corresponding to the above accuracy. Further, it is necessary that the extrinsic base region is spaced apart from an emitter region by a distance greater than the mask alignment accuracy. Thus, it is impossible to reduce the base capacitance and the base resistance in a great degree. Accordingly, it is impossible to further increase the operation speed of the bipolar transistor.

Similarly, it is very difficult to make small the areas of the source and drain regions of an MOS field effect transistor (hereinafter referred to as "MOSFET"), thereby reducing the junction capacitance of each of the source and drain regions. That is, it is impossible to further increase the operation speed of the MOSFET.

In order to solve the above difficulties of the bipolar transistor, for example, a semiconductor device formed of a bipolar transistor and a method of fabricating the device have been proposed in Japanese Patent Publication (JP-B) No. 55-26630 (1980). In this semi-conductor device, the base electrode of the bipolar transistor is connected with a polycrystalline semiconductor layer which is extended outwardly from an extrinsic base region, and hence the area of the extrinsic base region can be reduced, as compared with a case where the base electrode is connected directly with the extrinsic base region without interposing the polycrystalline semiconductor layer between the base electrode and the extrinsic base region. Further, according to the proposed method, the extrinsic base region is self-aligned to an emitter region, and hence the distance between the extrinsic base region and the emitter region can be reduced without being restricted by the mask alignment accuracy. That is, the base resistance of the bipolar transistor can be reduced.

In the proposed method of fabricating the above semiconductor device, however, it is required to etch the polycrystalline semiconductor layer made of polycrystalline silicon, at a position on the emitter or an intrinsic base region made of monocrystalline silicon. Since the polycrystalline silicon and the monocrystalline silicon are the same material, it is impossible to stop the etching action for the polycrystalline silicon just at the boundary between the polycrystalline silicon layer and the monocrystalline silicon region. Thus, a portion of the upper surface of the monocrystalline silicon region is obliged to be etched. Moreover, it is necessary to carry out etching such as reactive ion etching (hereinafter referred to as "RIE") and ion milling. Accordingly, a damaged layer due to ion bombardment is formed in the emitter or the intrinsic base region made of monocrystalline silicon. It is impossible to remove the damaged layer completely in subsequent fabrication steps, and hence a leakage current at the PN junction between the emitter region and the base region is increased. Accordingly, it is difficult to produce a bipolar transistor having desired characteristics at a high yield.

Further, the method of fabricating the above bipolar transistor is greatly different from an ordinary method for fabricating an MOSFET. Hence, it is very difficult to form the above bipolar transistor and an MOSFET on the same substrate.

Further, techniques relating to the above prior art are described in, for example, U.S. Pat. No. 4,583,106. The fabrication method described in this patent also encounters the above-mentioned problem.

While, for example, a method of fabricating a semiconductor device which is formed of an MOSFET having self-aligned electrodes, is proposed in an article entitled "A New MOSFET Structure with Self-Aligned Polysilicon Source and Drain Electrodes" (IEEE ELECTRON DEVICE LETTERS, Vol. EDL-5, No. 10, 1984, pp. 400 to 402). In this MOSFET, source and drain electrodes are kept in contact with polycrystalline silicon layers extending from source and drain regions, and hence the area of each of the source and drain regions can be reduced, as compared with a case where the source and drain electrodes are formed directly on the source and drain regions, respectively, without interposing a polycrystalline silicon layer between the source or drain electrode and the source or drain region. Thus, the junction capacitance of each of the source and drain regions can be reduced.

However, the proposed method for obtaining the above MOSFET includes a step of selectively etching a phosphorus-doped polycrystalline silicon layer by an etchant containing hydrofluoric acid, nitric acid and acetic acid. This etchant fails to etch the above silicon layer uniformly, and moreover can etch silicon oxides such as $SiO_2$ and PSG (namely, phosphosilicate glass). Thus, there is a danger of etching a polycrystalline silicon layer serving as a gate electrode, and a silicon oxide film serving as a gate insulating film.

In orderto lessen the so-called "short channel effect" caused by reducing the gate length and to prevent the degradation of performance due to the injection of hot carriers into a gate region, a lightly-doped layer for weakening an electric field is formed in the drain region. That is, it is necessary to provide an LDD structure (namely, lightly doped dorain structure) in an MOSFET. However, according to the above method, it is difficult to form the LDD structure in a stable manner. That is, it is very difficult by the method to fabricate an MOSFET which is small in gate length and has desired characteristics.

Further, the proposed fabrication method for obtaining the above MOSFET is greatly different from an ordinary method for fabricating a bipolar transistor, and hence it is very difficult to form the above MOSFET and a bipolar transistor on the same substrate.

SUMMARY OF THE INVENTION

It is an object of the present invention to provide a method of fabricating a bipolar transistor device, an MOSFET device or a composite device made up of a bipolar transistor and an MOSFET which method can overcome the above-mentioned drawbacks of the prior art.

Accordingly to an aspect of the present invention, there is provided a method of fabricating a semiconductor device comprising the steps of:

forming a layered structure of a desired pattern on a main surface of a single crystal semiconductor layer of one conductivity type, the structure having a side wall which defines said pattern and including a lower layer disposed at a lower level, a first insulating layer disposed at an intermediate level, and a first polycrystalline semiconductor layer heavily doped with n-type impurity and disposed at a higher level;

forming a second insulating layer on the side wall of the layered structure;

forming a second polycrystalline semiconductor layer on exposed surfaces of said single crystal semiconductor layer, said first polycrystalline semiconductor layer of the layered structure and said second insulating layer;

diffusing said n-type impurity in said first polycrystalline semiconductor layer of the layered structure into part of said second polycrystalline semiconductor layer disposed contiguous to the first polycrystalline semiconductor layer;

selectively etching away said part of the second polycrystalline semiconductor layer diffused with said n-type impurity and said first polycrystalline semiconductor layer, using said first and second insulating layers as an etching stopper;

doping the remaining part of said second polycrystalline semiconductor layer with conductivity-affording impurity; and heat-treating the device to drive the doped impurity in said second polycrystalline semiconductor layer to a surface region of said single crystal semiconductor layer, thereby forming a doped surface region in the single crystal semiconductor layer and a doped polycrystalline semiconductor layer electrically connected to said doped surface region and extending therefrom.

According to another aspect of the present invention, there is provided a method of fabricating a semiconductor device comprising the steps of:

forming layered structures of desired pattern on a main surface of a single crystal semiconductor layer, each of the structures having a side wall which defines said pattern and including a conductive layer disposed at a lower level, a first insulating layer disposed at an intermediate level, and a first polycrystalline semiconductor layer heavily doped with n-type impurity and disposed at a higher level;

forming a second insulating layer on the side walls of the layered structures;

forming a second polycrystalline semiconductor layer on exposed surfaces of said single crystal semiconductor layer, said first polycrystalline semiconductor layer of the layered structure and said second insulating layer;

diffusing said n-type impurity in said first polycrystalline semiconductor layer of each of said layered structures into each part of said second polycrystalline semiconductor layer disposed adjacent thereto;

selectively etching away the doped parts of said second polycrystalline semiconductor layer and all the first polycrystalline semiconductor layers using said first and second insulating layers as an etching stopper;

patterning the remaining second polycrystalline semiconductor layer;

doping the second polycrystalline semiconductor layer with conductivity-affording impurity; and heat-treating the device to drive the impurity in the second polycrystalline layer into the single crystal semiconductor layer, thereby forming source/drain regions of an insulated-gate field effect transistor and an extrinsic base of a bipolar transistor.

BRIEF DESCRIPTION OF THE DRAWINGS

FIGS. 1A to 1L are sectional views showing fabrication steps of an embodiment of a method of fabricating a semiconductor device in accordance with the present invention, which embodiment is used for forming a bipolar transistor.

DESCRIPTION OF THE PREFERRED EMBODIMENTS

Figure 2A:
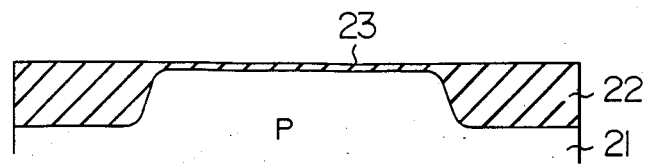
FIGS. 2A to 2J are sectional views showing fabrication steps of another embodiment of a method of fabricating a semiconductor device in accordance with the present invention, which embodiment is used for forming an N-channel MOSFET.

FIGS. 1A to 1L are sectional views showing fabrication steps of an embodiment of a method of fabricating a semiconductor device in accordance with the present invention, more particularly, steps of a fabrication method of bipolar transistor.

As shown in FIG. 1A, an N-type monocrystalline semiconductor layer 1 (for example, an N-type monocrystalline silicon layer) is first prepared, and a relatively thick insulating layer 2 made of silicon oxide $SiO_2$ is formed locally on a main surface of the semiconductor layer 1 so as to intrude partially into the semiconductor layer. Next, an insulating layer 3 made of silicon oxide and having a thickness of, for example, 200 Å is formed on the main surface of the semiconductor layer 1 by the ordinary thermal oxidation process. Then, boron ions $B^+$ are implanted into the semiconductor layer 1 through the insulating layer 3 and heat treatment is carried out, to form a P-type monocrystalline semiconductor layer (that is, an intrinsic base region) 4 in the semiconductor layer 1.

Next, as shown in FIG. 1B, a polycrystalline silicon film 5 which may be doped to be conductive as in the following embodiment and has a thickness of about 5,000 Å is deposited on the insulating layers 2 and 3, a silicon nitride film 6 having a thickness of about 500 Å is deposited on the polycrystalline silicon film 5, and a polycrystalline silicon film 7 containing an N-type impurity such as arsenic at a concentration of, for example, $1 \times 10^{21}$ atoms/cm$^3$ is deposited on the silicon nitride film 6 to a thickness of about 2,000 Å. Each of the films 5, 6 and 7 is formed by, for example, chemical vapor deposition.

Next, the three-layer film made up of the polycrystalline silicon film 5, the silicon nitride film 6 and the polycrystalline silicon film 7 is etched through photo-etching techniques and RIE techniques so that the three-layer film having a desired shape is left unetched as shown in FIG. 1C.

Next, as shown in FIG. 1D, a silicon oxide film 8 having a thickness of about 4,000 Å is formed by, for example, chemical vapor deposition. Then, the silicon oxide film 8 is etched through RIE techniques so that, as shown in FIG. 1E, an insulating layer 9 having a width of about 4,000 Å in a lateral direction is left on the side wall of the three-layer film 5, 6 and 7. By the above etching process, the surface 7A of the polycrystalline silicon film 7 and a surface area 4A of the P-type monocrystalline semiconductor layer 4 are both exposed.

Next, as shown in FIG. 1F, a polycrystalline silicon film 10 having a thickness of about 4,000 Å is formed by, for example, chemical vapor deposition, and the structure thus obtained is heat-treated at 950° C. in an atmosphere of nitrogen for about 10 minutes to diffuse the arsenic atoms of the polycrystalline silicon film 7 into that portion of the polycrystalline silicon film 10 which exists near the polycrystalline silicon film 7, thereby forming an N-type polycrystalline silicon region 10A.

Figure 3:
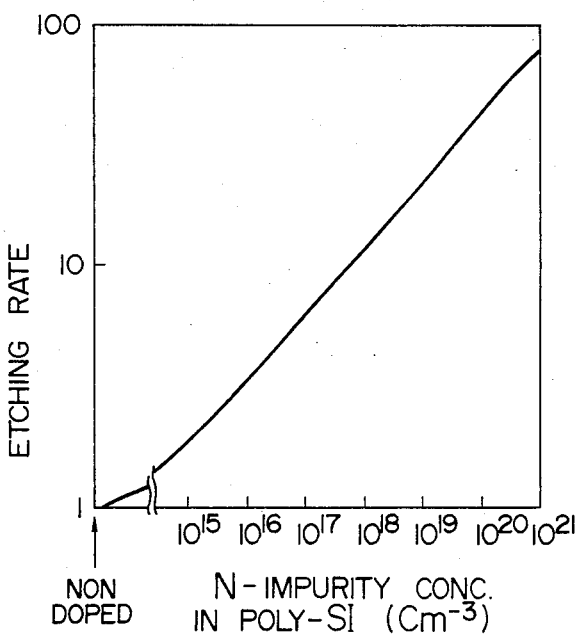
FIG. 3 is a graph showing a relation between the impurity concentration of polycrystalline silicon and the etching rate, for a case where polycrystalline silicon is etched by either plasma etching or photoexcitation etching.

Next, the polycrystalline silicon layers 10, 10A and 7 are subjected to the plasma etching using a Cl$_2$ gas or the so-called photo-excitation etching using chlorine radicals which are obtained by irradiating Cl$_2$ gas with, for example, ultraviolet rays from a low pressure mercury vapor lamp. Thus, as shown in FIG. 1G, the polycrystalline silicon layers 10A and 7 which are doped highly with arsenic, are selectively etched off in a self-alignment manner, and the remaining portion 10B of the polycrystalline silicon film 10 is left unetched in a state that the remaining polycrystalline silicon layer 10B may have two portions separated by the silicon nitride film 6 and the insulating layer 9. FIG. 3 shows a relation between the impurity concentration of polycrystalline silicon and the etching rate of the plasma etching or photo-excitation etching (each using Cl$_2$ gas) for polycrystalline silicon. As shown in FIG. 3, the etching rate for polycrystalline silicon containing arsenic at a concentration more than $10^{20}$ atoms/cm$^3$ is tens of times larger than the etching rate for polycrystalline silicon which does not contain arsenic. Thus, polycrystalline silicon containing arsenic can be readily etched off while leaving undoped polycrystalline silicon unetched.

Next, as shown in FIG. 1H, the polycrystalline silicon layer 10B is patterned through photo-etching techniques and RIE techniques so that the polycrystalline silicon layer 10B exists between the insulating layer 9 and a surface area of the insulating layer 2, and then the structure thus obtained is heat-treated at 850° C. in a stream of water vapor for 100 minutes, to perform thermal oxidation while using the silicon nitride film 6 as a mask, thereby forming a silicon oxide layer 11 which has a thickness of about 1,400 Å and serves as an insulating layer, at the surface of the polycrystalline silicon layer 10B. Next, for example, boron ions B$^+$ are implanted into the silicon layer 10B at an implant voltage of 60 Kev and a dose of $5 \times 10^{15}$ atoms/cm$^2$, and then predetermined heat treatment is carried out. Thus, the polycrystalline silicon layer 10B has the P-type conductivity, and a highly-doped P-type monocrystalline semiconductor layer (namely, an extrinsic base region) 12 is formed in that portion of the P-type monocrystalline semiconductor layer 4 which is kept in contact with the polycrystalline silicon layer 10B. At this time, the film 5 and the insulating layer 3 act as a mask for preventing boron from diffusing into that portion of the monocrystalline silicon layer 4 which exists under the film 5. Alternatively, the above ion implantation and heat treatment may be carried out before the insulating layer 11 is formed. Next, the silicon nitride film 6 is removed by, for example, hot phosphoric acid, and then the polycrystalline silicon film 5 is removed by, for example, the plasma etching using a CCl$_4$ gas. Here, the oxide film 3 can serve as an etching stopper for preventing etching of the underlying monocrystalline silicon layer 4. Then, the insulating layer 3 having a thickness of 200 Å is removed by, for example, an aqueous solution of hydrogen fluoride, to form a window or an aperture 13 as shown in FIG. 1I.

Next, a polycrystalline silicon film 14 having a thickness of 3,000 Å is formed by, for example, chemical vapor deposition. Then, for example, arsenic ions As$^+$ are implanted into this polycrystalline silicon film at an implant voltage of 60 KeV and a dose rate of $1 \times 10^{16}$ atoms/cm$^2$, and predetermined heat treatment is carried out. The polycrystalline silicon film 14 thus treated is patterned through photo-etching techniques and RIE techniques so that at least the aperture 13 is covered by a polycrystalline silicon layer 14 left unetched. Thus, the polycrystalline silicon layer 14 has the N-type conductivity, and as shown in FIG. 1J, an N-type monocrystalline semiconductor layer (namely, an emitter region) 15 is formed in that portion of the P-type semiconductor layer 4 which is kept in contact with the polycrystalline silicon layer 14.

Next, a silicon oxide film (not shown) is deposited on the whole surface, and a phosphosilicate glass film 16 is deposited on the silicon oxide film. Each of these films is formed by, for example, chemical vapor deposition. Then, as shown in FIG. 1K, the phosphosilicate glass film 16 is subjected to photo-etching and RIE, to form apertures 17 and 18 in those portions of the phosphosilicate glass film which exist on the N-type polycrystalline silicon layer 14 and the P-type polycrystalline silicon layer 10B, thereby exposing a surface area of each of the layers 14 and 10B.

Next, a conductive film is deposited on the whole surface, for example, by sputtering, and then subjected to photo-etching and RIE as shown in FIG. 1L, to form an electrode 19 which is kept in contact with the layer 14 and extended to the surface of the phosphosilicate glass film 16 through the aperture 17, and an electrode 20 which is kept in contact with the layer 10B and extended to the surface of the phosphosilicate glass film 16 through the aperture 18.

In the above, explanation has been made of an embodiment of a fabrication method of bipolar transistor according to the present invention. A bipolar transistor which is fabricated by the present embodiment and is shown in FIG. 1L, is an NPN transistor in which the semiconductor layers 4 and 12 are used as a base region, the layer 15 is used as an emitter region, and the remaining portion of the semiconductor layer 1 is used as a collector region. As shown in FIG. 1L, the layers 4 and 12 serving as the base region is connected to the electrode 20 (namely, a base electrode) through the layer 10B, and the layer 15 serving as the emitter region is connected to the electrode 19 (namely, an emitter electrode) through the layer 14. Since the base electrode 20 is kept in contact with the polycrystalline silicon layer 10B which is extended from the base region 12 and 4, the area of the layer 12 can be made small, and thus the capacitance of the junction between the collector and base of the bipolar transistor can be reduced. Further, the distance between the emitter region 15 and the highly-doped P-type base layer 12 can be made smaller than the width of the insulating layer 9 in the lateral direction, that is, the layer 12 can be provided in close proximity to the emitter region 15. Accordingly, the base resistance can be reduced, and the transistor can show excellent high-frequency characteristics. According to the present embodiment, not only the advantages such as a reduction in junction capacitance and a decrease in base resistance are enhanced, but also the drawback of formation of damaged layer in the emitter region 15 or base region 4 can be completely prevented. In more detail, according to the present embodiment, when the polycrystalline silicon film 5 is etched off as shown in FIG. 1I, by one of the plasma etching, the reactive ion etching (RIE) and the wet etching using an alkali solution, the etching action for the film 5 can be substantially stopped at the surface of the silicon oxide layer 3 because the etching rate for silicon oxide is far smaller than that for polycrystalline silicon. Accordingly, in the above etching process, the damaged layer is not formed in the emitter region 15 and the base region 4. Further, the silicon oxide layer 3 is very thin, and hence can be readily removed by, for example, the wet etching using an aqueous solution of hydrogen fluoride, without causing damage to the regions 15 and 4. Thus, according to the present embodiment, a bipolar transistor having desired characteristics can be readily formed and produced at a high yield rate.

FIGS. 2A to 2J are sectional views showing fabrication steps of a method of fabricating a semiconductor device, more specifically an N-channel MOSFET according to another embodiment of the present invention.

As shown in FIG. 2A, a P-type monocrystalline semiconductor layer 21 made of, for example, P-type monocrystalline silicon is first prepared, and a thick insulating layer 22 made of silicon oxide is formed locally in a main surface of the semiconductor layer 21 so as to form a LOCOS structure partially intruding into the semiconductor layer 21. Then, a silicon oxide layer 23 having a thickness of, for example, 200 Å is formed on the main surface of the semiconductor layer 21 by the ordinary thermal oxidation process, to be used as a gate insulating layer.

Figure 2B:
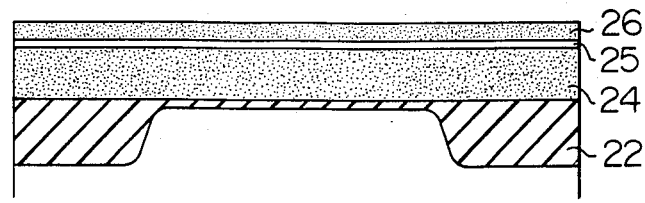

Next, as shown in FIG. 2B, a phosphorus-doped polycrystalline silicon film 24 is deposited on the whole surface, a silicon nitride film 25 having a thickness of about 500 Å is deposited on the film 24, and a polycrystalline silicon film 26 containing an N-type impurity such as arsenic at a concentration of about $1 \times 10^{21}$ atoms/cm$^3$ is deposited on the silicon nitride film 25 to a thickness of about 2,000 Å. Each of the films 24, 25 and 26 is formed by, for example, chemical vapor deposition.

Figure 2C:
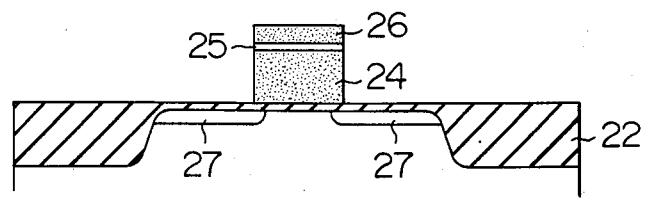

Next, a three-layer film made up of the polycrystalline silicon film 24, the silicon nitride film 25 and the polycrystalline silicon film 26 is subjected to photo-etching and RIE (namely, reactive ion etching) to leave the three-layer film of a desired shape unetched, as shown in FIG. 2C, and then the ion implantation is carried out while using the three-layer film as a mask, to form lightly-doped N-type source and drain regions 27.

Figure 2D:
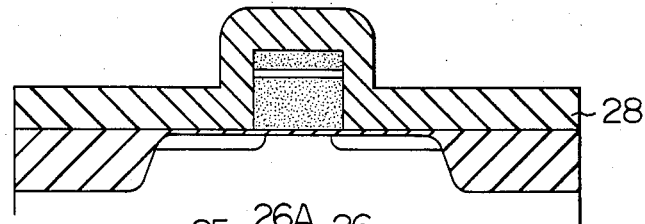
Figure 2E:
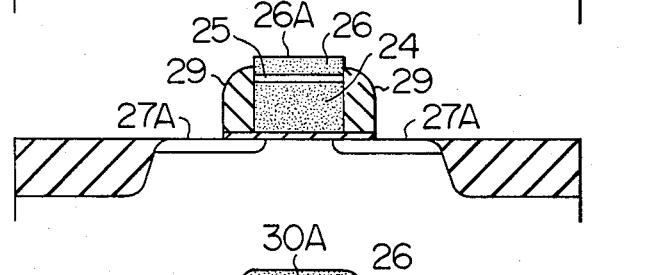

Next, a silicon oxide film 28 having a thickness of 3,500 Å is formed as shown in FIG. 2D by, for example, chemical vapor deposition. Then, the silicon oxide film 28 is etched through RIE techniques so that, as shown in FIG. 2E, an insulating layer 29 having a width of about 3,500 Å in a lateral direction is left on the side wall of the three-layer film 24, 25 and 26. By this etching process, the surface 26A of the polycrystalline silicon film 26 and a surface area 27A of each of the source and drain regions 27 are exposed.

Figure 2F:
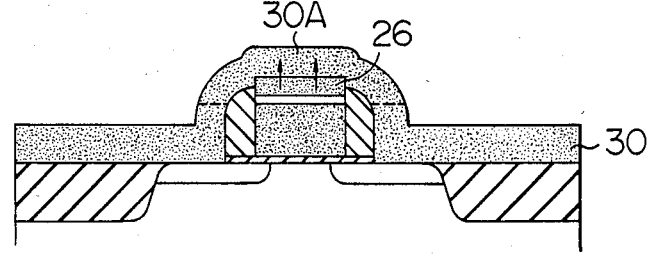

Next, a polycrystalline silicon film 30 having a thickness of about 3,500 Å is formed as shown in FIG. 2F by, for example, chemical vapor deposition, and the structure thus obtained is heat-treated at 950° C. in an atmosphere of nitrogen for about 10 minutes. Thus, arsenic atoms contained in the polycrystalline silicon film 26 are diffused into that portion of the polycrystalline silicon film 30 which is in contact to or contiguous to the film 26, to form an N-type polycrystalline silicon region 30A in the film 30.

Figure 2G:
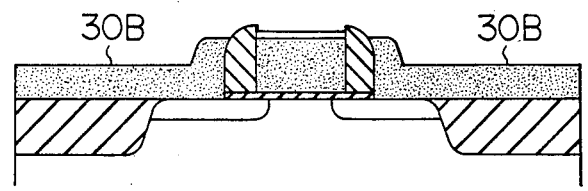

Next, the layer 30A, the remaining portion of the film 30, and the film 26 are subjected to either the plasma etching using a Cl$_2$ gas or the so-called photoexcitation etching using Cl radials which are obtained by irradiating Cl$_2$ gas with, for example, ultraviolet rays from a low pressure mercury vapor lamp. Thus, as shown in FIG. 2G, the film 26 and the layer 30A which are doped highly with arsenic, are selectively etched off in a self-alignment manner, and the remaining portions of the film 30, that is, two polycrystalline silicon layers 30B are left unremoved and are separated by the silicon nitride film 25 and the insulating layer 29. The plasma etching method and the photo-excitation method each utilizing Cl$_2$ gas have the etching characteric shown in FIG. 3. Hence, only the film 26 and the layer 30A which contain arsenic, are selectively etched off by one of the above methods, and the undoped layer 10B is left unetched.

Figure 2H:
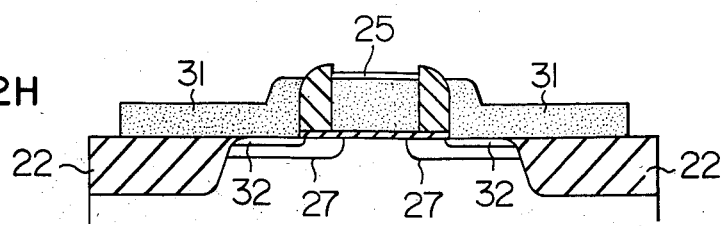

Next, as shown in FIG. 2H, the polycrystalline silicon layer 30B is etched through photo-etching techniques and RIE techniques so that the polycrystalline silicon layers 30B left unetched are extended from the insulating layer 29 to the surface of the insulating layer 22. Then, aresnic ions As+ are implanted into the polycrystalline silicon layers 30B at an implant voltage of 60 KeV and a dose rate of $1 \times 10^{16}$ atoms/cm$^2$ and predetermined heat treatment is carried out, to convert the layer 30B into an N-type polycrystalline silicon layer 31 and to form highly-doped N-type source and drain regions 32 in the lightly-doped N-type source and drain regions 27.

Figure 2I:
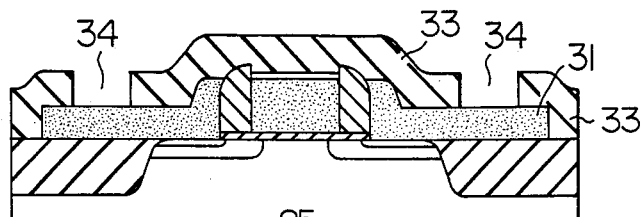

Next, a silicon oxide film (not shown) is deposited on the whole surface, and a phosphosilicate glass film 33 is deposited on the above silicon oxide film. Each of these films is formed by, for example, chemical vapor deposition. Then, the phosphosilicate glass film 33 is subjected to photo-etching and RIE, to form apertures 34 in the film 33 as shown in FIG. 2I, thereby exposing desired surface areas of the polycrystalline silicon layer 31. The nitride film 25 is also at least partially and preferably totally removed to expose the polycrystalline layer 24.

Figure 2J:
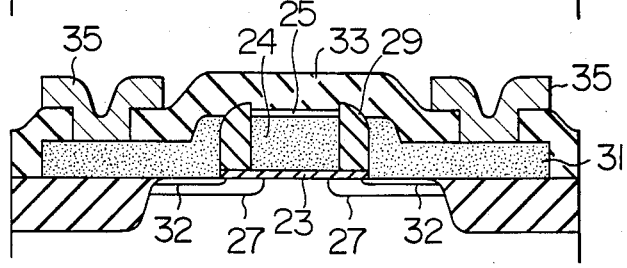

Next, a conductive film is formed, for example, by sputtering, and then etched through photo-etching techniques and RIE techniques so that electrodes 35 are left as shown in FIG. 2J, that is, each of the electrodes 35 is kept in contact with the polycrystalline silicon layer 31 and extended to the surface of the phosphosilicate glass film 33 through the aperture 34. Also, a gate electrode contacting the doped polycrystalline layer 24 is formed.

In the above, explanation has been made of an embodiment of a fabrication method of an N-channel MOSFET according to the present invention. In the MOSFET which is fabricated by the present embodiment and shown in FIG. 2J, the source and drain regions each indicated by the lightly-doped N-type region 27 and the highly-doped N-type region 32 are connected to the electrodes 35 through the polycrystalline silicon layer 31. Thus, the area of each of the regions 27 and 32 can be made small, and the capacitance of the junction between the P-type semiconductor layer 21 and the source or drain region can be reduced. That is, the MOSFET can show excellent high-frequency characteristics. According to the present embodiment, not only the above advantages of high speed operation, high packing density, etc. are enhanced, but also the drawback of the conventional method can be eliminated. That is, according to the present embodiment, when the N-type polycrystalline silicon layers 30A and 26 are selectively etched off by one of the plasma etching and the photo-excitation etching each utilizing a $Cl_2$ gas, the layers 30A and 26 are uniformly etched, and moreover the etching action is surely stopped at the surface of the silicon nitride film 25 and the surface of the insulating layer 29 made of silicon oxide, because the etching rate for silicon nitride and silicon oxide is far smaller than that for N-type polycrystalline silicon. Accordingly, the polycrystalline silicon film 24 (serving as a gate electrode) and the gate insulating layer 23 are not damaged by the above etching process. Further, as shown in FIG. 2J, the LDD structure (namely, lightly doped domain structure) for lessening the so-called "short channnel effect" and for preventing the injection of hot carriers into a gate region can be formed, without using any special process. Thus, according to the present embodiment, an MOSFET having desired characteristics can be readily obtained.

Most of the main steps of the fabrication method shown in FIGS. 1A to 1L are compatible with those of the fabrication method shown in FIGS. 2A to 2J. Accordingly, the bipolar transistor shown in FIG. 1L and the MOSFET shown in FIG. 2J can be readily integrated on the same substrate.

Now, explanation will be made of a further embodiment of a method of fabricating a semiconductor device in accordance with the present invention, by reference to FIGS. 4A to 4K.

FIGS. 4A to 4K are sectional views showing fabrication procedures of a composite semiconductor which includes a bipolar transistor and a complementary MOS (namely, the combination of an N-channel MOSFET and a P-channel MOSFET) formed on the same substrate.

Figure 4A:
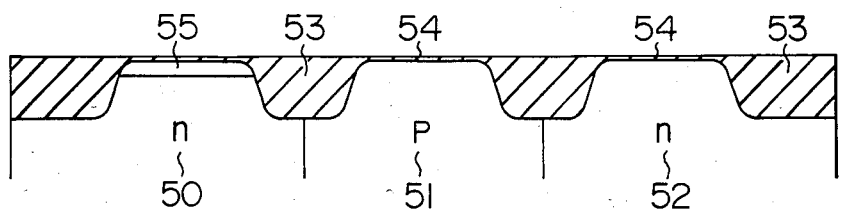
FIGS. 4A to 4K are sectional views showing fabrication steps of a further embodiment of a method of fabricating a semiconductor device in accordance with the present invention, which embodiment is used for forming a composite semiconductor device made up of a bipolar transistor and a complementary MOS.

As shown in FIG. 4A, N-type monocrystalline semiconductor layers 50 and 52 and a P-type monocrystalline semiconductor layer 51 are first formed in a main surface of a semiconductor substrate, and a thick insulating layer 53 made of silicon oxide is formed locally on the main surface so as to intrude in the semiconductor layers 50, 51 and 52. Then, an insulating layer 54 made of silicon oxide and having a thickness of, for example, 150 Å is formed on the main surface by the ordinary thermal oxidation process. Further, boron ions B+ are implanted into the semiconductor layer 50 through the insulating layer 54 and heat treatment is carried out, to form a P-type monocrystalline semiconductor layer (namely, an intrinsic base region) 55 in the N-type layer 50.

Figure 4B:
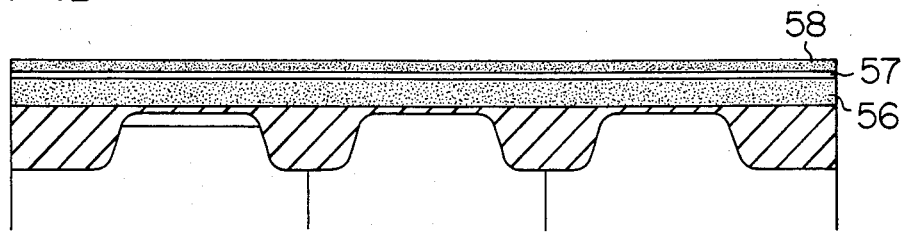

Next, as shown in FIG. 4B, a phosphorus-doped polycrystalline silicon film 56 having a thickness of 4,000 Å is deposited on the whole surface, a silicon nitride film 57 having a thickness of 500 Å is deposited on the film 56, and a polycrystalline silicon film 58 containing an N-type impurity such as arsenic at a concentration of, for example, $1 \times 10^{21}$ atoms/cm$^3$ is deposited on the silicon nitride film 57 to a thickness of about 2,000 Å. Each of the films 56, 57 and 58 is formed by, for example, chemical vapor deposition.

Figure 4C:
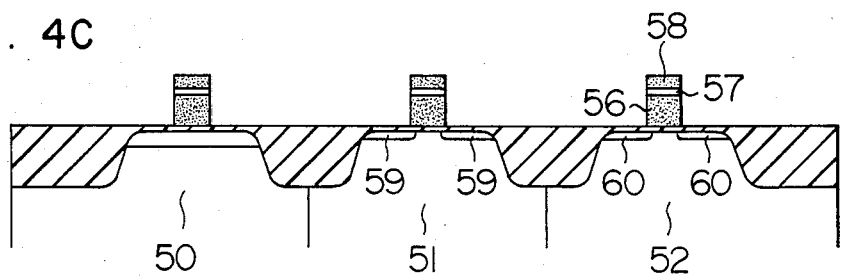

Next, a three-layer film made up of the polycrystalline silicon film 56, the silicon nitride film 57 and the polycrystalline silicon film 58 is subjected to photo-etching and RIE (namely, reactive ion etching), to form a pattern shown in FIG. 4C. Then, ion implantation is carried out while using the three-layer film as a mask, to form lightly-doped N-type source and drain regions 59 in the semiconductor layer 51 and to form lightly-doped P-type source and drain regions 60 in the semiconductor layer 52.

Figure 4D:
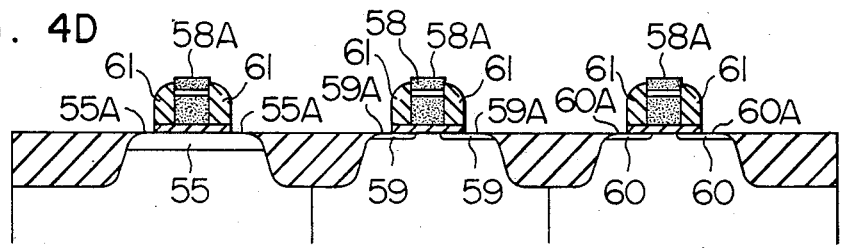

Next, a silicon oxide film having a thickness of 3,000 Å is formed on the whole surface by, for example, chemical vapor deposition, and is then etched through photo-etching techniques and RIE techniques so that, as shown in FIG. 4D, an insulating layer 61 having a width of about 3,000 Å in a lateral direction is left on the side wall of the three-layer film 56, 57 and 58. The surface 58A of the polycrystalline silicon film 58, a surface area 55A of the semiconductor layer 55, the surface 59A of the source and drain regions 59, and the surface 60A of the source and drain regions 60 are all exposed by the above etching process.

Figure 4E:
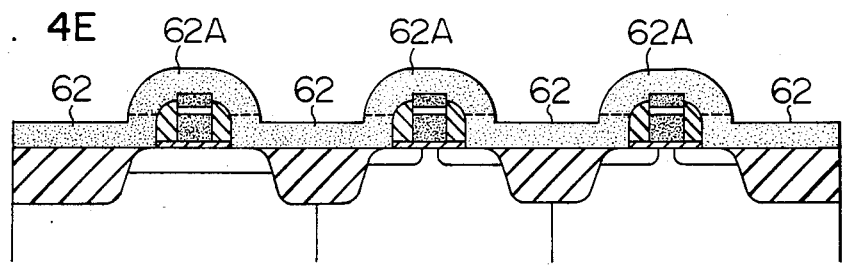
Figure 4F:
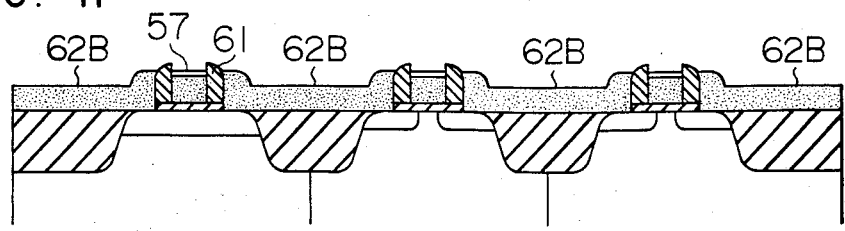

Next, as shown in FIG. 4E, a polycrystalline silicon film 62 having a thickness of about 4,000 Å is formed by, for example, chemical vapor deposition, and the structure thus obtained is maintained at 950° C. in an atmosphere of nitrogen for about 10 minutes, to diffuse arsenic atoms of the polycrystalline silicon film 58 into that portion of the polycrystalline silicon film 62 which is contiguous to the film 58, thereby forming an N-type polycrystalline silicon layer 62A. Then, the polycrystalline silicon layers 62, 62A and 58 are subjected to plasma etching using $Cl_2$ gas or the so-called photoexcitation etching using Cl radicals which are obtained by irradiating a $Cl_2$ gas with, for example, ultraviolet rays from a low pressure mercury vapor lamp. Thus, as shown in FIG. 4F, the polycrystalline silicon layer 62A and polycrystalline silicon film 58 which are doped highly with arsenic, are selectively etched off in a self-alignment manner, and the remaining portion of the polycrystalline silicon film 62, that is, an undoped polycrystalline silicon layer 62B is left unetched in a state that the layer 62B is separated into parts by the silicon nitride film 57 and the insulating layer 61.

Figure 4G:
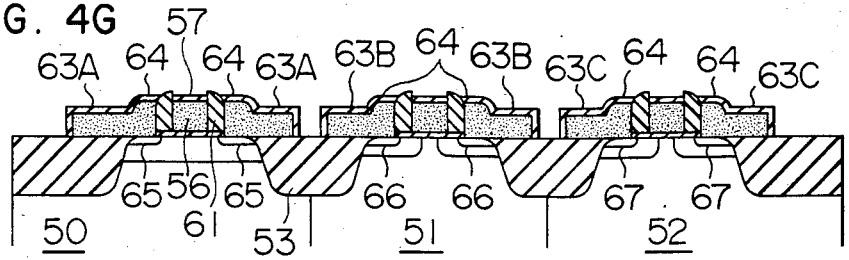

Next, the polycrystalline silicon layer 62B is etched into such a pattern, for example, through photoetching techniques that the polycrystalline silicon layer 62B left unetched is extended from the insulating layer 61 to the surface of the insulating layer 53 as shown in FIG. 4G. Then, the structure thus obtained is maintained at 850° C. in a stream of water vapor for 80 minutes, to form an insulating layer 64 which is made of silicon oxide and has a thickness of about 1,200 Å, at the surface of the polycrystalline silicon layer 62B. In the above oxidation process, the silicon nitride film 57 acts as a mask for preventing the oxidation of the polycrystalline silicon film 56. Next, ion implantation is carried out in the following manner. For example, boron ions B+ are implanted into those portions of the polycrystalline silicon layer 62B which exist on the semiconductor layers 50 and 52, at an implant voltage of 50 KeV and a dose rate of $5 \times 10^{15}$ atoms/cm$^2$, and arsenic ions As+ are implanted into that portion of the polycrystalline silicon film 62B which exists on the semiconductor layer 51, at an implant voltage of 260 KeV and a dose rate of $1 \times 10^{16}$ atoms/cm$^2$. Then, predetermined heat treatment is carried out. Thus, P-type polycrystalline silicon layers 63A and 63C, a highly-doped P-type extrinsic base region 65, and highly-doped P-type source and drain regions 67 are formed. Further, an N-type polycrystalline silicon layer 63B and highly-doped N-type source and drain regions 66 are formed.

Figure 4H:
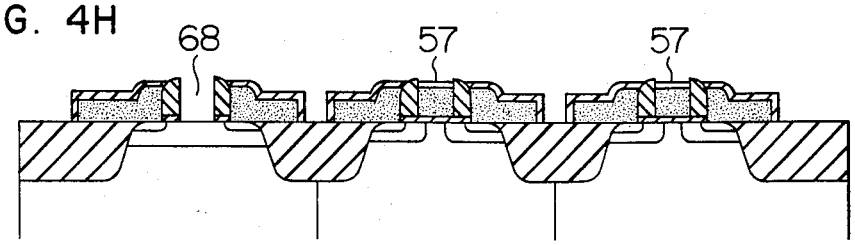

Next, the silicon nitride film 57 and the polycrystalline silicon film 56 which exist over the semiconductor layer 50, are removed through photo-etching techniques and RIE techniques using the insulating layer 61 as an etching stopper, and the insulating layer 54 which exists on the semiconductor layer 50 and has a thickness of 150 Å, is removed by, for example, an aqueous solution of hydrogen fluoride, to form an aperture 68 as shown in FIG. 4H.

Figure 4I:
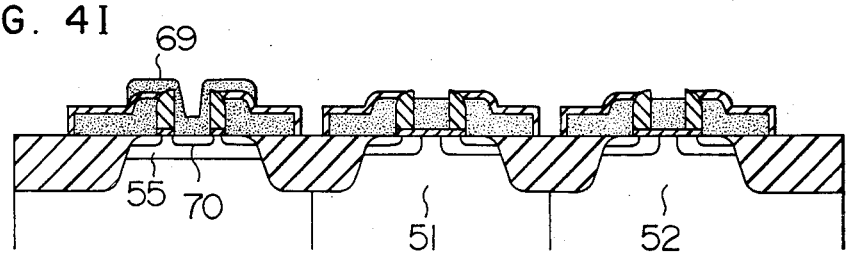

Next, a polycrystalline silicon film 69 having a thickness of 2,000 Å is formed by, for example, chemical vapor deposition. Then, for example, arsenic ions As+ are implanted into the above polycrystalline silicon film at an implant voltage of 60 KeV and a dose rate of $1 \times 10^{16}$ atoms/cm$^2$, and predetermined heat treatment is carried out. The polycrystalline silicon film thus treated is etched through photo-etching techniques and RIE techniques into such a pattern that at least the aperture 68 is covered by the polycrystalline silicon film left unetched. Thus, as shown in FIG. 4I, an N-type polycrystalline silicon layer 69 is formed, and an N-type monocrystalline semiconductor layer 70 serving as an emitter region is formed in that portion of the semiconductor layer 55 which exists near the polycrystalline silicon layer 69. Subsequently, the silicon nitride film 57 existing over each of the semiconductor layers 51 and 52 is removed by, for example, hot phosphoric acid.

Figure 4J:
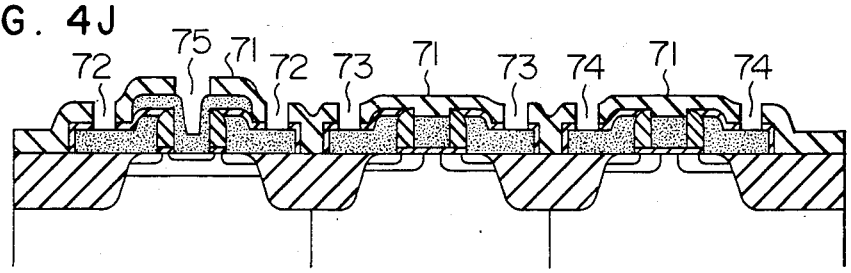

Next, a silicon oxide film (not shown) is deposited on the whole surface, and a phosphosilicate glass film 71 is deposited on the above silicon oxide film. Each of these films is formed by, for example, chemical vapor deposition. Those portions of the phosphosilicate glass film 71 which exist on the polycrystalline silicon layers 63A, 63B, 63C and 69, are etched through photo-etching techniques and RIE techniques, to form apertures 72 to 75 as shown in FIG. 4J, thereby exposing a surface area of each of the layers 63A, 63B, 63C and 69.

Figure 4K:
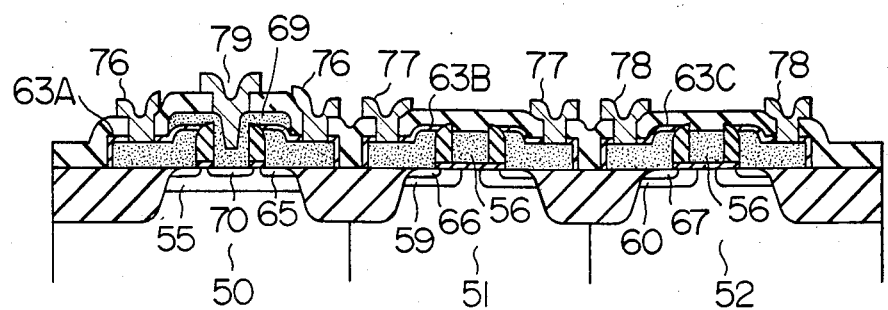

Next, a conductive film is formed on the whole surface, for example, by sputtering, and then etched through photo-etching techniques and RIE techniques so that electrodes 76 to 79 are left unetched as shown in FIG. 4K. In more detail, the electrode 76 of for example aluminum or silicide of refractory metal kept in contact with the layer 63A is extended to the surface of the phosphosilicate glass film 71 through the aperture 72, the electrode 77 kept in contact with the layer 63B is extended to the surface of the glass film 71 through the aperture 73, the electrode 78 kept in contact with the layer 63C is extended to the surface of the glass film 71 through the aperture 74, and the electrode 79 kept in contact with the layer 69 is extended to the surface of the glass film 71 through the aperture 75.

In the above, explanation has been made of an embodiment of a method of fabricating a composite semiconductor device which includes a bipolar transistor and a complementary MOS formed on the same substrate, in accordance with the present invention. The semiconductor device of FIG. 4K fabricated by the present embodiment includes an NPN transistor in which the regions 55 and 65 are used as a base region, the region 70 is used as an emitter region, and the remaining portion of the semiconductor layer 50 is used as a collector region, an N-channel MOSFET in which a set of regions 59 and 66 is used as a source region, another set of regions 59 and 66 is used as a drain region, and the film 56 is used as a gate, and a P-channel MOSFET in which a set of regions 60 and 67 is used as a source region, another set of regions 60 and 67 is used as a drain region, and the film 56 is used as a gate. Further, in the above device, the regions 65, 66 and 67 are connected to the electrodes 76, 77 and 78 through the layers 63A, 63B and 63C, respectively. Accordingly, the area of each of the regions 65, 66 and 67 can be reduced, in size as compared with a case where the electrodes 76, 77 and 78 are connected directly with the regions 65, 66 and 67, respectively, without using intervening layers 63A, 63B and 63C. Thus, the junction capacitance between the collector and base of the NPN transistor and the junction capacitance at each of the source and drain regions of the N-channel or P-channel MOSFET can be reduced. Further, the distance between the emitter region 70 and the extrinsic base region 65 can be readily made smaller than the width of the insulating layer 61 in the lateral direction, and hence the base resistance can be greatly reduced. Furthermore, when the polycrystalline silicon film 56 is etched off as indicated by the aperture 68 of FIG. 4H, the silicon oxide layer 54 acts as a protective film, and the monocrystalline silicon layer 55 is not damaged. Additionally, the LDD structure for lessening the so-called "short channel effect" and for preventing the injection of hot carriers into a gate region can be readily formed in each of the N-channel and P-channel MOSFETS.

Thus, a composite semiconductor device which includes a bipolar transistor and a complementary MOS and has excellent high-frequency characteristics, can be readily formed and produced at a high yield.

In the present embodiment, the polycrystalline silicon film 56 is used as the gate, by way of example. Alternatively, the gate may be made of the silicide of a refractory metal such as tungsten silicide $WSi_2$ and titanium silicide $TiSi_2$.

Figure 5:
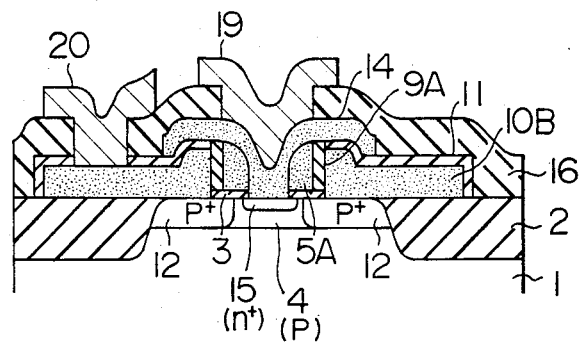
FIGS. 5 and 6 are sectional views showing examples of a bipolar transistor fabricated in accordance with the present invention which are different from the example shown in FIG. 1L.

Now, another embodiment of a fabrication method of a bipolar transistor according to the present invention will be explained below, by reference to FIG. 5. FIG. 5 shows a modified version of the bipolar transistor shown in FIG. 1L. Accordingly, the following explanation of the present embodiment will be limited to fabrication steps concerning a transistor part, in which the transistor of FIG. 5 is different from the transistor of FIG. 1L. Referring to FIG. 5, an insulating layer 9A which is made of silicon oxide and has a width of, for example, 1,500 Å in the lateral direction, is formed on the side wall of the three-layer film 5, 6 and 7 in the steps of FIGS. 1D and 1E. Further, when the film 5 is etched in the step of FIG. 1I, anisotropic etching is carried out by, for example, the RIE method, to leave that portion of the film 5 which exists in the neighborhood of the insulating layer 9A, unetched. Thus, a polycrystalline silicon layer 5A having a width of 2,500 Å in the lateral direction is left on the side wall of the insulating layer 9A. That portion of the insulating layer 3 which is not covered by the layer 5A, that is, an exposed portion of the insulating layer 3 is etched off by, for example, an aqueous solution of hydrogen fluoride, to expose a surface area of the semiconductor layer 4. Thereafter, substantially the same processing as shown in FIGS. 1J to 1L is carried out, and thus the NPN transistor of FIG. 5 is fabricated. According to the present embodiment, not only the drawback of the prior art can be eliminated as in the embodiment of FIGS. 1A to 1L, but also the width of the emitter region 15 in the lateral direction can be made smaller than the lateral width of the three-layer film 5, 6 and 7 of FIG. 1C determined by the size of a mask which is used for leaving the above three-layer film unetched. Accordingly, the lateral width of the intrinsic base region 4 existing beneath the emitter region 15 can be reduced, and thus the base resistance can be made smaller than that of the transistor of FIG. 1L. That is, a bipolar transistor having more excellent high-frequency characteristics can be fabricated by the present embodiment.

Figure 6:
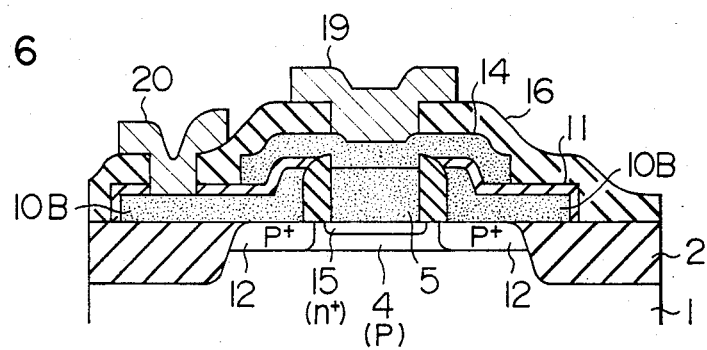

Next, a further embodiment of a fabrication method of bipolar transistor according to the present invention will be explained below, by reference to FIG. 6. FIG. 6 shows another modified version of the bipolar transistor shown in FIG. 1L. Accordingly, the following explanation of the present embodiment will be limited to fabrication steps concerning a transistor part, in which the transistor of FIG. 6 is different from the transistor of FIG. 1L. Before the films 5, 6 and 7 are deposited in the step of FIG. 1B, the insulating layer 3 is removed. The silicon nitride film 6 is deposited to a thickness of, for example, 2,000 Å. In the step of FIG. 1G, boron ions B+ are implanted into the semiconductor layer 4. At this time, the silicon nitride film 6 is used as a mask. Then, predetermined heat treatment is carried out, to form the region 12. Thereafter, the insulating layer 11 made of silicon oxide is formed. In the step of FIG. 1I, only the silicon nitride film 6 is removed. Thereafter, substantially the same processing as shown in FIGS. 1J to 1K is carried out, to form an NPN transistor. Like the embodiment shown in FIGS. 1A to 1L, the present embodiment can eliminate the drawback of the prior art.

Figure 7:
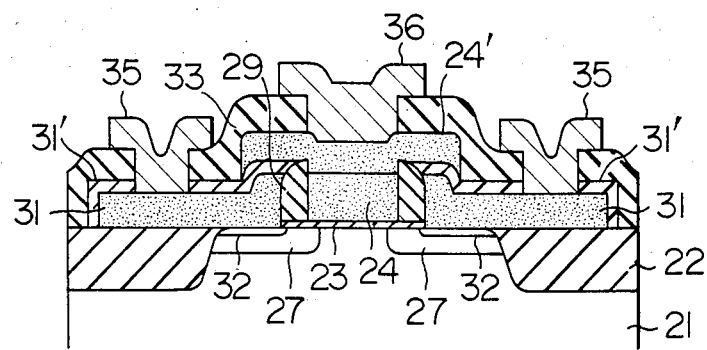
FIGS. 7 and 8 are sectional views showing examples of an N-channel MOSFET fabricated in accordance with the present invention which are different from the example shown in FIG. 2J.

Next, another embodiment of a fabrication method of an MOSFET according to the present invention will be explained below, by reference to FIG. 7. FIG. 7 shows a modified version of the MOSFET shown in FIG. 2J. Accordingly, the following explanation of the present embodiment will be limited to fabrication steps concerning a part, in which the MOSFET of FIG. 7 is different from that of FIG. 2J. In the step of FIG. 2H, an insulating layer 31' made of silicon oxide is deposited on the layer 31. At this time, the silicon nitride film 25 is used as a mask. Then, the silicon nitride film 25 is removed. Further, a phosphorus-doped polycrystalline silicon film 24' is formed so as to cover the film 24 and to be extended to the surface of the insulating layer 31'. In the step of FIG. 2I, an aperture is formed in the phosphosilicate glass film 33 at a position on the layer 24'. An electrode 36 is formed so as to fill up this aperture. Thus, an N-channel MOSFET is fabricated.

According to the present embodiment, not only the drawback of the conventional method can be eliminated as in the embodiment of FIGS. 2A to 2J, but also the area of an MOSFET can be reduced, as compared with a case where the polycrystalline silicon film 24 is extended to a position existing over the insulating layer 22, and a gate electrode is formed on the film 24 at this position, since the electrode 36 is provided on the polycrystalline silicon film 24' which exists over the insulating layer 23.

Figure 8:
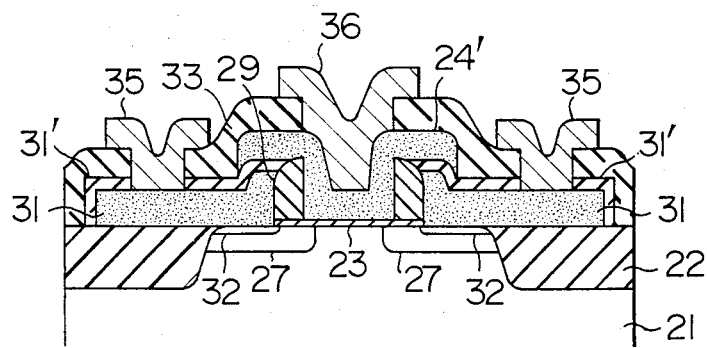

A further embodiment of a fabrication method of MOSFET according to the present invention will be explained below, by reference to FIG. 8. FIG. 8 shows another modified version of the MOSFET shown in FIG. 2J. Accordingly, the following explanation of the present embodiment will be limited to fabrication steps concerning a part, in which the MOSFET shown in FIG. 8 is different from that shown in FIG. 2J. In the step of FIG. 2H, an insulating layer 31' made of silicon oxide is formed on the layer 31. At this time, the silicon nitride film 25 is used as a mask. Then, the films 24 and 25 are removed. Thereafter, for example, a phosphorus-doped polycrystalline silicon film 24' is formed so as to cover the insulating layer 23 and to be extended to the surface of the insulating layer 31'. In the step of FIG. 2J, an aperture is formed in the phosphosilicate glass film 33 at a position on the layer 24', and an electrode 36 is formed so as to fill up the aperture. Thus, an N-channel MOSFET is formed. The present embodiment has the same advantages as the embodiment which has been explained by reference to FIG. 7.

The fabrication methods of N-channel MOSFET which have been explained by reference to FIGS. 2A to 2J, FIG. 7 and FIG. 8, are applicable to the fabrication of a P-channel MOSFET without losing the above-mentioned advantages. Further, main steps of those fabrication methods of a bipolar transistor which have been explained by reference to FIGS. 1A to 1L, FIG. 5 and FIG. 6 are equal to the main steps of those fabrication methods of MOSFET which have been explained by reference to FIGS. 2A to 2J, FIG. 7 and FIG. 8. Accordingly, a bipolar transistor and an MOSFET can be readily formed on the same substrate by combining one of the above fabrication methods of bipolar transistor with one of the above fabrication methods of an MOSFET. Thus, a composite semiconductor device can be readily formed which includes a bipolar transistor and an MOSFET, and has excellent high-frequency characteristics.

As explained in the foregoing, according to the present invention, the junction capacitance between the base and collector of a bipolar transistor can be made small, and the base resistance thereof can be reduced. Further, in the fabrication process, there is no danger of damage to the monocrystalline emitter and base regions. That is, a bipolar transistor having excellent high-frequency characteristics can be readily formed and produced at a high yield.

Further, according to the present invention, the junction capacitance at each of the source and drain regions of an MOSFET can be reduced, and moreover the LDD structure for lessening the short channel effect can be readily formed. Thus, an MOSFET having excellent high-frequency characteristics can be readily formed and produced at a high yield.

Furthermore, some main steps of the fabrication method of the above bipolar transistor are compatible with those of the fabrication method of the above MOSFET, and hence a composite semiconductor device which is made up of the bipolar transistor and the MOSFET and has excellent high-frequency characteristics, can be readily formed and produced at a high yield.

We claim:

1. A method of fabricating a semiconductor device, comprising the steps of:

forming a layered structure of a desired pattern on a main surface of a single crystal semiconductor layer of one conductivity type, the structure having a side wall which defines said pattern and including a lower layer disposed at a lower level, a first insulating layer disposed at an intermediate level, and a first polycrystalline semiconductor layer heavily doped with n-type impurity and disposed at a higher level;

forming a second insulating layer on the side wall of the layered structure;

forming a second polycrystalline semiconductor layer on exposed surfaces of said single crystal semiconductor layer, said first polycrystalline semiconductor layer of the layered structure and said second insulating layer;

diffusing said n-type impurity in said first polycrystalline semiconductor layer of the layered structure into part of said second polycrystalline semiconductor layer disposed contiguous to the first polycrystalline semiconductor layer;

selectively etching away said part of the second polycrystalline semiconductor layer diffused with said n-type impurity and said first polycrystalline semiconductor layer, using said first and second insulating layers as an etching stopper;

doping the remaining part of said second polycrystalline semiconductor layer with conductivity-affording impurity; and heat-treating the device to drive the doped impurity in said second polycrystalline semiconductor layer to a surface region of said single cyrstal semiconductor layer, thereby forming a doped surface region in the single crystal semiconductor layer and a doped polycrystalline semiconductor layer electrically connected to said doped surface region and extending therefrom.

2. A method of fabricating a semiconductor device according to claim 1, wherein said semiconductor device is a bipolar transistor, said conductivity-affording impurity has said one conductivity type, said single crystal semiconductor layer constitutes an intrinsic base region, and said doped surface region constitutes an extrinsic base region.

3. A method of fabricating a semiconductor device according to claim 2, further comprising the steps of:

removing said first insulating layer and said lower layer to expose the surface of said single crystal semiconductor layer;

forming a third polycrystalline semiconductor layer doped with impurity of the other conductivity type opposite to said one conductivity type on the exposed surface of said single crystal semiconductor layer; and heat-treating the device to drive the impurity in the third polycrystalline semiconductor layer, thereby forming another doped surface region in the single crystal semiconductor layer, said another doped region, constituting an emitter region.

4. A method of fabricating a semiconductor device according to claim 3, further comprising the step of oxidizing a surface portion of said second polycrystalline layer prior to the formation of said third polycrystalline layer, thereby forming a third insulating layer isolating said second and third polycrystalline layers.

5. A method of fabricating a semiconductor device according to claim 1, wherein said semiconductor device is an insulated gate field effect transistor, said conductivity-affording impurity has the other conductivity type opposite to said one conductivity type, said single crystal semiconductor layer constitutes a channel region and said surface region constitutes a source/drain region.

6. A method of fabricating a semiconductor device according to claim 5, further comprising the step of forming a gate insulating layer on the remaining surface of said single crystal semiconductor layer, prior to the formation of said layered structure, wherein said lower layer is formed of an electrically conductive material and constitutes an insulated gate.

7. A method of fabricating a semiconductor device according to claim 6, further comprising the step of doping impurity of the other conductivity type to said single crystal semiconductor layer using said layered structure as a mask, prior to the formation of said second polycrystalline layer, thereby forming lightly doped source/drain regions.

8. A method of fabricating a semiconductor device including a bipolar transistor, comprising the steps of:

forming a layered structure of a desired pattern on a main surface of a single crystal semiconductor layer of one conductivity type, the structure having a side wall which defines said pattern and including a lower layer disposed at a lower level, a first insulating layer disposed at an intermediate level, and a first polycrystalline semiconductor layer heavily doped with n-type impurity and disposed at a higher level;

forming a second insulating layer on the side wall of the layered structure;

forming a second polycrystalline semiconductor layer on exposed surfaces of said single crystal semiconductor layer, said layered structure and said second insulating layer;

diffusing said n-type impurity in said first polycrystalline semiconductor layer of the layered structure into part of said second polycrystalline semiconductor layer disposed on the first polycrystalline semiconductor layer;

selectively etching away said part of the second polycrystalline semiconductor layer diffused with said n-type impurity and said first polycrystalline semiconductor layer;

selectively converting an outer surface part of said second polycrystalline semiconductor layer into an insulating material, thereby forming a third insulating layer;

removing said first insulating layer and said conductive layer, using said third insulating layer as a mask, to expose said single crystal semiconductor layer; and forming a third polycrystalline semiconductor layer doped with impurity of a conductivity type opposite to said one conductivity type, on at least said exposed semiconductor layer.

9. A method of fabricating a semiconductor device as set forth in claim 8, further comprising the step of doping impurity of said one conductivity type in said second polycrystalline semiconductor layer after said selective etching step and before said selective converting step.

10. A method of fabricating a semiconductor device as set forth in claim 9, further comprising the step of forming metal electrodes which contact said second and third polycrystalline semiconductor layers.

11. A method of fabricating a semiconductor device as set forth in claim 8, further comprising the step of forming a thin insulating film on the main surface of the single crystal semiconductor layer before the step of forming the layered structure.

12. A method of fabricating a semiconductor device as set forth in claim 11, further comprising the step of removing said thin insulating film exposed in said window before the step of forming the third polycrystalline semiconductor layer.

13. A method of fabricating a semiconductor device as set forth in claim 12, wherein said semiconductor is silicon, said thin insulating film is formed of silicon oxide, said layered structure consists of a doped polycrystalline silicon layer serving as the conductive layer, a nitride layer serving as the first insulating layer and another doped polycrystalline silicon layer serving as the first polycrystalline semiconductor layer.

14. A method of fabricating a semiconductor device, comprising the steps of:
forming a first insulating layer locally on a main surface of a semiconductor layer of a first conductivity type so that the first insulating layer is embedded in the semiconductor layer;
forming a second insulating layer on that area of the main surface of the semiconductor layer which is surrounded by the first insulating layer;
forming a first semiconductor region of a second conductivity type in that portion of the semiconductor layer which is surrounded by the first insulating layer;
forming a three-layer film over a limited portion of the first semiconductor layer through a patterning process, the three-layer film being made up of a bottom layer which is a first conductive layer, an intermediate layer which is a third insulating layer and a top layer which is a first polycrystalline semiconductor layer doped highly with an N-type impurity;
forming a fourth insulating layer on the side wall of the three-layer film, the fourth insulating layer having a predetermined width in a lateral direction;
exposing a surface area of the first semiconductor region other than that surface area thereof which is covered by the three-layer film and the fourth insulating layer;
forming a second polycrystalline semiconductor layer on the whole surface;
carrying out heat treatment to diffuse the N-type impurity of the first polycrystalline semiconductor layer into that region of the second polycrystalline semiconductor layer which is contiguous to the first polycrystalline semiconductor layer;
etching off the whole of the first polycrystalline semiconductor layer and that region of the second polycrystalline semiconductor layer, in which the N-type impurity has been diffused;
carrying out pattern processing for the second polycrystalline semiconductor layer so that the second polycrystalline semiconductor layer exists only between the fourth insulating layer and a surface area of the first insulating layer;
converting the surface of the second polycrystalline semiconductor layer into a fifth insulating layer while using the third insulating layer as a mask;
implanting ions into the second polycrystalline semiconductor layer through the fifth insulating layer and carrying out heat treatment, to cause the second polycrystalline semiconductor layer to have the second conductivity type and to form a highly-doped semiconductor region of the second conductivity type in that portion of the first semiconductor region which is kept in contact with the second polycrystalline semiconductor layer, the highly-doped semiconductor region being higher in the concentration of an impurity for determining the second conductivity type than the first semiconductor region;
selectively removing the third insulating layer;
removing at least a portion of the first conductive layer other than that portion thereof which exists in close proximity to the fourth insulating layer;
removing the second insulating layer to expose the first semiconductor region;
forming a third polycrystalline semiconductor layer on the whole surface;
implanting ions into the third polycrystalline semiconductor layer and carrying out heat treatment, to cause the third polycrystalline semiconductor layer to have the first conductivity type and to form a second semiconductor region of the first conductivity type in that portion of the first semiconductor region which is kept in contact with the third polycrystalline semiconductor layer;
carrying out pattern processing for the third polycrystalline semiconductor layer so that the third polycrystalline semiconductor layer covers the second semiconductor region and is extended to the surface of the fifth insulating layer;
forming a first electrode so that the first electrode is kept in contact with that portion of the second polycrystalline semiconductor layer which exists on the first insulating layer; and
forming a second electrode so that the second electrode is kept in contact with the third polycrystalline semiconductor layer, thereby obtaining a semiconductor device formed of a bipolar transistor, in which the semiconductor layer, the first semiconductor region, the second semiconductor region, the first electrode and the second electrode are used as a collector region, a base region, an emitter region, a base electrode and an emitter electrode, respectively.

15. A method of fabricating a semiconductor device including an insulated gate field effect transistor, comprising the steps of:
forming a layered structure of a desired pattern on a main surface of a single crystal semiconductor layer of one conductivity type, the structure having side walls which define said pattern and including a conductive layer disposed at a lower level, a first insulating layer disposed at an intermediate level, and a first polycrystalline semiconductor layer heavily doped with n-type impurity and disposed at a higher level;

forming second insulating layers on the side walls of the layered structure;

forming a second polycrystalline semiconductor layer on exposed surfaces of said single crystal semiconductor layer, said layered structure and said second insulating layer;

diffusing said n-type impurity in said first polycrystalline semiconductor layer of the layered structure into part of said second polycrystalline semiconductor layer disposed on the first polycrystalline semiconductor layer;

selectively etching away said part of the second polycrystalline semiconductor layer diffused with said n-type impurity and said first polycrystalline semiconductor layer;

doping impurity into remaining portions of said second polycrystalline semiconductor layer and the single crystal semiconductor layer disposed thereunder; and forming electrical contacts to said conductive layer and said remaining portions of the second polycrystalline semiconductor layer.

16. A method of fabricating a semiconductor device as set forth in claim 15, further comprising the step of forming a thin insulating film on the main surface of the single crystal semiconductor layer before the step of forming the layered structure.

17. A method of fabricating a semiconductor device, comprising the steps of:

forming at least one first semiconductor region of a first conductivity type and at least one second semiconductor region of a second conductivity type in a main surface of a semiconductor layer of the first conductivity type;

forming a three-layer film having a desired shape on each of the first and second semiconductor regions, the three-layer film being made up of a bottom layer which is a conductive film, an intermediate layer which is a silicon nitride film, and a top layer which is a first polycrystalline silicon film doped with one of arsenic and phosphorus;

forming a first insulating layer on the side wall of the three-layer film;

forming a second polycrystalline silicon film on the whole surface, and diffusing said one of arsenic and phosphorus from the first polycrystalline silicon film into the second polycrystalline silicon film;

selectively etching off the first polycrystalline silicon film and that portion of the second polycrystalline silicon film, in which said one of arsenic and phosphorus has been diffused;

forming a second insulating layer at least on the surface of that portion of the second polycrystalline film which exists on the second semiconductor region;

removing the silicon nitride film and the conductive film which exist on the second semiconductor region, while using the second insulating layer as a mask, to form an aperture; and forming a third polycrystalline silicon film so that the aperture is covered by the third polycrystalline silicon film.

18. A method of fabricating a semiconductor device, comprising the steps of:

forming layered structures of desired pattern on a main surface of a single crystal semiconductor layer, each of the structures having a side wall which defines said pattern and including a conductive layer disposed at a lower level, a first insulating layer disposed at an intermediate level, and a first polycrystalline semiconductor layer heavily doped with n-type impurity and disposed at a higher level;

forming a second insulating layer on the side walls of the layered structures;

forming a second polycrystalline semiconductor layer on exposed surfaces of said single crystal semiconductor layer, said first polycrystalline semiconductor layer of the layered structure and said second insulating layer;

diffusing said n-type impurity in said first polycrystalline semiconductor layer of each of said layered structures into each part of said second polycrystalline semiconductor layer disposed adjacent thereto;

selectively etching away the doped parts of said second polycrystalline semiconductor layer and all the first polycrystalline semiconductor layers using said first and second insulating layers as an etching stopper;

patterning the remaining second polycrystalline semiconductor layer;

doping the second polycrystalline semiconductor layer with conductivity-affording impurity; and heat-treating the device to drive the impurity in the second polycrystalline layer into the single crystal semiconductor layer, thereby forming source-/drain regions of an insulated-gate field effect transistor and an extrinsic base of a bipolar transistor.

19. A method of fabricating a semiconductor device, comprising the steps of:

forming a plurality of first semiconductor regions of a first conductivity type and a plurality of second semiconductor regions of a second conductivity type in a main surface of a single crystal semiconductor layer of the first conductivity type;

forming a third semiconductor region of the first conductivity type in at least one of said second semiconductor regions;

forming a three-layer structure of a desired pattern on each of said first and second semiconductor regions, each of said structure having a side wall and including a conductive layer disposed at a lower level, a first insulating layer disposed at an intermediate level, and a first polycrystalline semiconductor layer heavily doped with n-type impurity and disposed at a higher level;

forming a second insulating layer on the side wall of the three-layer structure;

forming a second polycrystalline semiconductor layer on exposed surfaces of said single crystal semiconductor layer, said three-layer structure and said second insulating layer;

diffusing said n-type impurity in said first polycrystalline semiconductor layer into part of said second polycrystalline semiconductor layer disposed thereon;

selectively etching away the part of said second polycrystalline semiconductor layer diffused with said n-type impurity and said first polycrystalline semiconductor layer;

selectively converting an outer surface part of said second polycrystalline semiconductor layer at least above said third semiconductor region into an insulating material, thereby forming a third insulating layer;

removing at least partially said first insulating layer and said conductive layer at least on said third semiconductor region, thereby forming a window; and forming a third polycrystalline semiconductor layer adjacent to said third semiconductor region to cover at least said window.

* * * * *